United States Patent
Ruile et al.

(10) Patent No.: US 7,170,372 B2
(45) Date of Patent: Jan. 30, 2007

(54) CONVERTER FOR SURFACE WAVES WITH IMPROVED SUPPRESSION OF INTERFERING EXCITATION

(75) Inventors: Werner Ruile, München (DE); Thomas Bauer, München (DE); Michael Jakob, München (DE); Ulrike Rösler, Hebertshausen (DE)

(73) Assignee: EPCOS AG, Munich (DE)

( * ) Notice: Subject to any disclaimer, the term of this patent is extended or adjusted under 35 U.S.C. 154(b) by 188 days.

(21) Appl. No.: 10/484,708

(22) PCT Filed: May 21, 2002

(86) PCT No.: PCT/DE02/01835

§ 371 (c)(1),
(2), (4) Date: Jun. 3, 2004

(87) PCT Pub. No.: WO03/012987

PCT Pub. Date: Feb. 13, 2003

(65) Prior Publication Data

US 2004/0247153 A1    Dec. 9, 2004

(30) Foreign Application Priority Data

Jul. 24, 2001    (DE) ................ 101 35 871

(51) Int. Cl.
*H02H 9/64* (2006.01)

(52) U.S. Cl. .................. 333/196; 310/313 C

(58) Field of Classification Search .......... 333/196; 310/313 C
See application file for complete search history.

(56) References Cited

U.S. PATENT DOCUMENTS 3,699,364 A * 10/1972 Gerard ............... 310/313 C (Continued)

FOREIGN PATENT DOCUMENTS

EP    0 533 431    3/1993

(Continued)

OTHER PUBLICATIONS

Ruppel et al, "SAW Devices for Consumer Communication Applications", *IEEE Transactions on Ultrasonics Ferroelectrics and Frequency Control*, vol. 40, No. 5, Sep. 1993, pp. 438-451.

(Continued)

*Primary Examiner*—Barbara Summons
(74) *Attorney, Agent, or Firm*—Schiff Hardin LLP

(57) ABSTRACT

An electro-acoustic transducer for a component operating with surface waves, in particular for a surface wave filter, in which, to suppress interfering excitation ensuing in the gap region adjacent an end of a finger, a variation of the gaps is implemented with regard to at least one feature selected from transversal arrangement, size and shape. Due to the slight dimension change of the position of the gap in comparison to the finger length, the desired primary excitation in the transducer remains approximately unchanged, however the interfering excitation is displaced or divided, and made ineffectual.

32 Claims, 5 Drawing Sheets

U.S. PATENT DOCUMENTS

| | | | | |
|---|---|---|---|---|
| 4,472,653 | A * | 9/1984 | Yamada | 310/313 C |
| 4,684,907 | A * | 8/1987 | Zibis | 333/196 |
| 5,136,266 | A * | 8/1992 | Niitsuma | 333/154 |
| 5,654,680 | A * | 8/1997 | Kwan et al. | 333/195 |
| 6,025,763 | A * | 2/2000 | Morimoto | 333/195 |
| 6,271,617 | B1 * | 8/2001 | Yoneda et al. | 310/313 D |
| 6,522,219 | B2 * | 2/2003 | Takamiya et al. | 333/133 |
| 6,559,739 | B2 * | 5/2003 | Solie | 333/196 |

FOREIGN PATENT DOCUMENTS

| | | | | |
|---|---|---|---|---|
| JP | 54-63651 | * | 5/1979 | |
| JP | 59-201512 | * | 11/1984 | 333/194 |
| JP | 2-170610 | * | 7/1990 | 333/193 |
| JP | 5-291868 | * | 11/1993 | 310/313 B |
| JP | 9-153753 | * | 6/1997 | |

OTHER PUBLICATIONS

Hohkawa et al, "Surface Acoustic Wave Filters Without Apodization Loss", *Electronics and Communications in Japan*, vol. 62-A, No. 2, 1979, pp. 10-17.

* cited by examiner

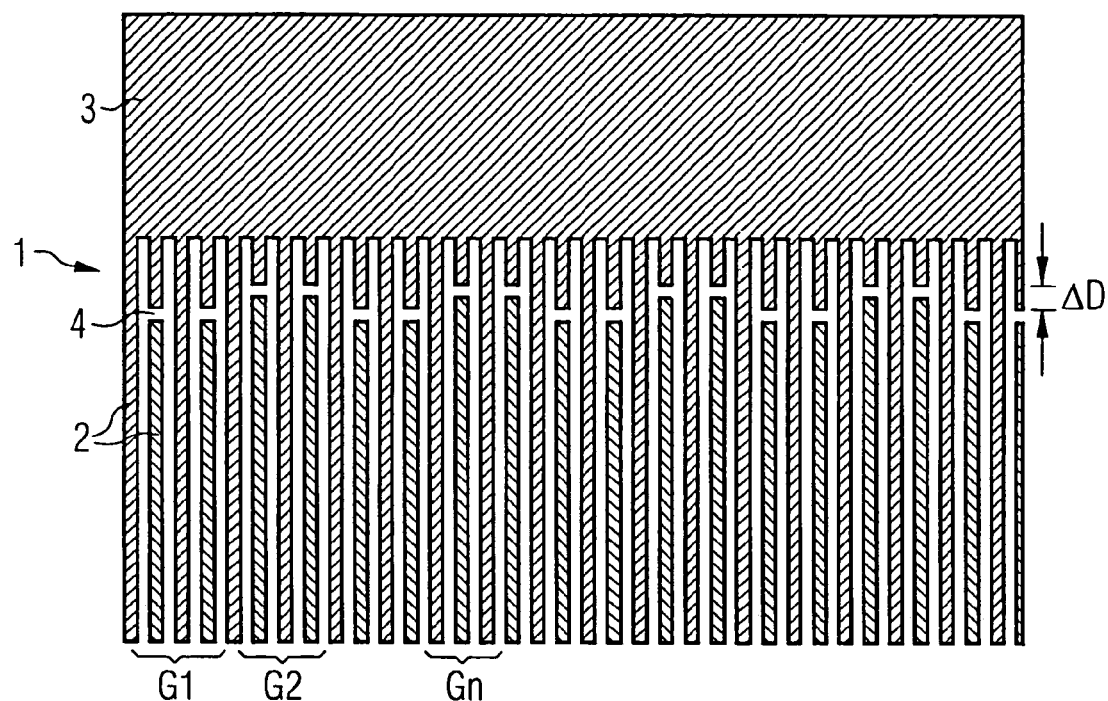
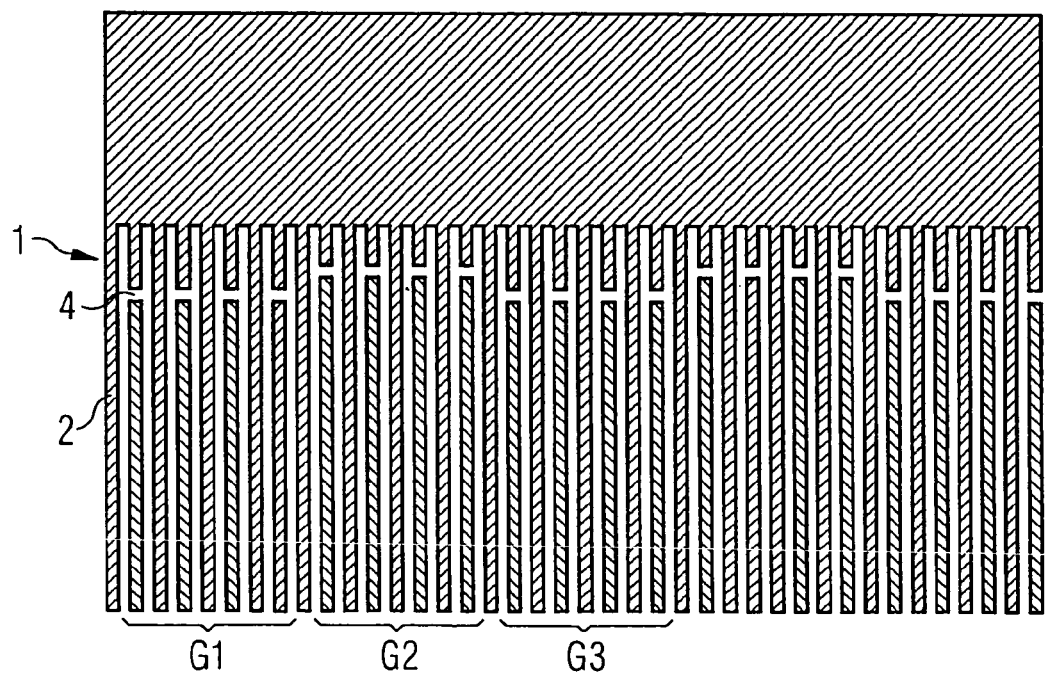

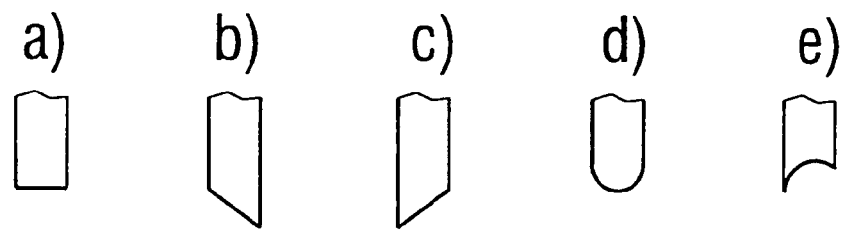
FIG 5 a) b) c) d) e)
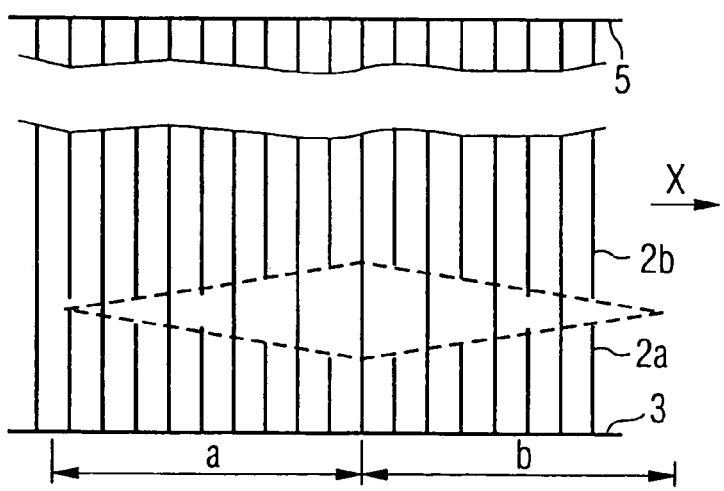
FIG 6
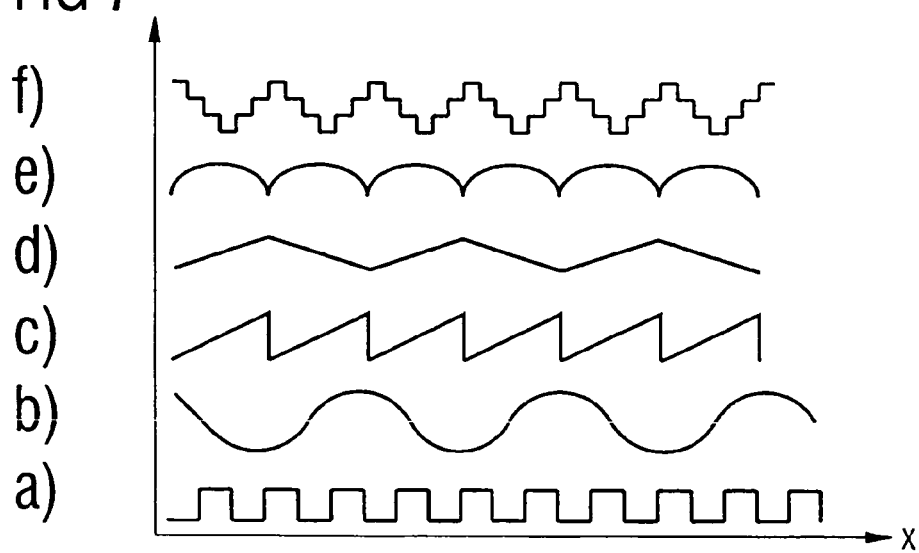
FIG 7

CONVERTER FOR SURFACE WAVES WITH IMPROVED SUPPRESSION OF INTERFERING EXCITATION

BACKGROUND OF THE INVENTION

A surface wave component comprises at least one electro-acoustic transducer that is arranged on a crystalline or ceramic piezoelectric thin film. The electro-acoustic transducer possesses a periodic finger structure, whereby the fingers are as a rule alternately connected to two different collector electrodes (busbars). The period of the finger structure determines the resonance frequency of the transducer, which corresponds to the frequency in which the electro-acoustic conversion ensues with the greatest degree of efficiency. Given a surface wave resonator, the impedance of the resonator is approximately zero at the resonance frequency.

The important properties of the transducer are substantially determined by number, width, separation and connection sequence of the electrode fingers, as well as by the aperture of the transducer. These are, as a rule, selected such that, as exclusively as possible, only an acoustic vibration mode is excited, on which the design is optimized with regard to the cited variable parameters.

An application for surface wave components is the assembly of reactance filters made from surface wave single-port resonators. An important characteristic of this reactance filter is the insertion dampening, which corresponds to the maximum dampening of a signal passing through the filter in the transmission range. Everything that the insertion dampening increases degrades the performance of the overall system, such that here as well the least losses are to be prevented.

Resonators that are used in the parallel branch of reactance filters should exhibit above their resonance frequency an optimally vanishing real portion of the input admittance. A real portion (differing there from zero) of the input admittance of the parallel resonator namely leads to an unwanted conductivity in the transmission range, to a drain of the signal energy, and to an increased insertion dampening. The input admittance of a single-port resonator typically used today now shows precisely a shoulder in this range, that therewith leads to an increased input dampening in a reactance filter. However, for this or also even for other known shoulders, as of yet no measures are known in order to effectively suppress them.

SUMMARY OF THE INVENTION

It is therefore the object of the present invention to specify a electro-acoustic transducer for a component operating with surface waves in which this loss mechanism is suppressed, and with whose help in particular surface wave filters can be produced that exhibit an improved insertion dampening.

This object is inventively achieved by an electro-acoustic transducer for a component operating with surface waves to form a surface wave filter. The transducer has interdigital fingers on a crystalline or ceramic piezoelectric thin film with the number, width, longitudinal position and connective sequence of the fingers as well as the aperture determining the properties of the transducer, means for suppressing interfering excitation from occurring in the region of the finger ends by having variations in the gaps selected from transversal arrangement, size and shape of the gaps, wherein the dimension changes and displacements of the gaps due to the variations are small in comparison to the finger length.

The inventors have recognized that the region of the transversal gaps, thus the region of the finger ends of the transducer fingers, generates a residual conductivity. This residual conductivity could be associated with an interfering excitation in the region of the transversal gaps that leads to an additional conductance that lies between the resonance and the middle of the stop band. This direct excitation only partially participates in the reflection events, since in a normal finger transducer a gap is present in the gap region at each second finger, and therefore each second finger fails as a reflection location. In spite of this, the excitation ensues, and namely via scatter fields that lead in the gap region to an excitation with an approximated (sin x)/x behavior. This excitation (that manifests itself as a parallel conductivity) must additively be considered in the admittance of the main excitation.

The invention now specifies a transducer in which this interfering excitation is modified in the gap region such that it is either suppressed or shifted to a frequency position at which it does not interfere when this, for example, is sufficiently removed from the passband, or when sufficient dampening already exists there. An inventive transducer is designed for this in the conventional manner with regard to number, width, longitudinal position and connection sequence of the fingers, as well as with regard to its aperture, whereby the substantial properties of the transducer that determine its main oscillation mode are established. To suppress the interfering excitation, however, the gaps undergo a variation with regard to at least one feature, which is selected from transversal arrangement, size and shape of the gaps. The dimension change of the gaps or, respectively, of the amount of the displacement of the gaps as a consequence of the variation is thereby kept small in comparison to the finger length.

Every single variation of the gaps along the transducer leads to an interference of the excitation in the region of the gaps, which leads to a displacement or dampening of the unwanted excitation. It is therewith possible to remove the unwanted excitation from the interfering region of the stop band.

A preferred method to suppress the interfering excitation is achieved when the variation of the gaps is not static, but rather ensues periodically varied can be expressed as a one-dimensional quantity that then varies from gap to gap, such that the individual gap features follow a periodic envelope over the length of the transducer.

It is inventively also possible to combine at least two gaps into a group, and to effect the periodic variation from group the group. Each group can thereby comprise the same or a different number of gaps. Each group can exhibit a pattern, formed by the total number of the gaps associated with the group, which pattern is defined from the relative transversal arrangement, the size, and/or the shape of the gaps within the group. The periodic variation can now ensue by changing at least one parameter from group to group. However, it is also possible to provide a pattern at least largely in conformity in each group that, however, varies from group to group with regard to its absolute transversal position in the transducer, and in particular exhibits a periodic variation over the length of the transducer.

With the invention, it is achieved to suppress the unwanted excitation or to displace it so far that it no longer ensues interferingly. The primary mode, which determines the substantial properties and in particular the passband of the filter, remains practically unchanged. The invention can therefore be used in all types of transducers that comprise a plurality of comb-like interlocking electrode fingers, independent of a given transducer design. The invention thereby uses the fact that the interfering excitation exhibits in the gap region a (sin x)/x behavior, which can also correspondingly be changed and influenced like a normal excitation. In particular, the association of at least, respectively, two gaps with a group, and its periodic change over all groups, provides that the excitation function (in this case the interfering excitation in the gap region) is multiplied in the time range by a function whose period corresponds to the length of a group. If, for example, groups are respectively formed into two groups, and these groups are respectively transversally and alternately displaced against each other, a folding in the frequency range results for the interfering excitation that leads to a splitting of the excitation. Two new admittances are made from the original admittance interfering in the stop band that, in comparison to the original interfering admittance, are substantially reduced in their strength and lie far from the stop band, and therewith no longer interfere.

Other periodic variations of gaps or, respectively, gap groups in the inventive transducer lead to a more complex splitting of the original interfering excitation in the gap region. Independent of the type of the modification, this leads both to a displacement and to a reduction of the interfering excitation or, respectively, of the interfering conductance of the transducer.

Variable quantities are gap separation, transversal position and shape of the gaps. The variation can possess one, a plurality or all of these features. While transversal position and gap separation (size of the gap or, respectively, transversal separation of the finger ends) can be represented as one-dimensional quantities via which an arbitrary envelope viewed over the length of the transducer can be set as a periodic or aperiodic variation, the shape of the gaps represents only a zero-dimensional quantity in which the variation is undirected or, respectively, no variation function can follow. Variations alone with regard to the gap shape are preferably implemented such that groups of gaps are formed that respectively exhibit a uniform shape of the gaps or a pattern made from different gap shapes, and that the gap shape or the pattern of gap shapes varies from group to group. The shape of the gaps is thereby determined by the two-dimensional fashioning of the finger ends, which in conventional transducer fingers is rectangular. Inventive transducers can comprise arbitrarily shaped finger ends that, for example, are rounded or slanted, or any other shape.

Although the invention also exhibits a variation of the gap separation, this is, however, preferably fashioned with minimal size, since in the manner the interfering excitation that first ensue via the gaps can be further suppressed.

According to a further embodiment of the invention, in the gap region finger sections not galvanically connected with the remaining electrode fingers or with the busbars are provided.

A further simple possibility for variation exists in the simultaneous variation of transversal gap position and gap separation. Such a variation is achieved when the finger ends of the transducer fingers and the stump fingers associated therewith of the respective busbar lying opposite are considered independent of one another, and, viewed independently over the length of the transducer, are varied respectively according to a function in the transversal arrangement. The variation of transversal position of electrode fingers and stump fingers can thereby ensue independently, however preferably with the same period.

A possible embodiment of the invention also concerns transducers in which the gaps are not respectively formed between a stump finger end and the corresponding electrode finger end, but rather between the electrode finger end and the corresponding adjacent busbar. In this case, the position of the electrode finger end can be varied over the transducer to vary the gap size. The variation of the transversal gap position is also achieved in the inventive transducers without stump fingers via varying widths of the busbar. The edge of the busbar facing the finger end can thereby follow the position of the finger end, such that, in the region of a short electrode finger, the busbar is fashioned wider in the same measure, and a constant gap separation results. Different gap separations are also possible, just like a variation of the gap shape in the transducers without stump fingers.

Inventive transducers can exhibit a variation in the gap region on only one side of the transducer, thus in the region only one busbar, however preferably on both sides. The variation is preferably effected on both sides in the same manner. However, in cases of significantly different transducer surroundings on different sides, it can also be advantageous to correspondingly design the variation of the gaps differently on both sides.

In a further embodiment of the invention, the gaps are combined into groups that respectively in turn comprise at least two sub-groups. Each sub-group exhibits a sub-group pattern, formed from size and/or shape of the gaps and/or from the relative transversal position of the gaps within the sub-group. In each group, at least two different sub-group patterns are provided that occur alternately at least once per group. Moreover, each sub-group pattern can in turn exhibit a periodic variation with regard to at least one feature. In this manner, it is achieved to modulate the excitation in the gap region with at least two different functions that possess different periods. This leads to a multiple splitting of the interfering admittance, and therewith to a further improved suppression of the interfering signal in the excitation behavior of the inventive transducer.

Periodic variations within a sub-group or within a group, with regard to the transversal arrangement and/or size of the gaps, can be effected sinusoidally, triangularly, sawtooth-shaped, semicircularly or following other periodic functions. The variation can moreover be linear or comprise a combination from a plurality of linear variations. For example, the variation can be linear with regard to the absolute transversal position of the gaps in the transducer, or with regard to the relative transversal position of the gaps within a group or sub-group. However, a periodic variation can also, for example, comprise a combination of the linearly rising and linearly falling gap positions. In the same manner, such a variation can naturally also concern the gap size, thus the separation from the electrode finger ends to the stump fingers ends.

The linear variations or combinations of the linear variations of at least one feature of the gaps can also be combined with other variations, for example the sinusoidal or semicircular variations. Given a variation with regard to the gap separation, the shape of the finger ends, and also the shape of the gaps, can follow the envelope for the gap separations applied along the transducer length.

As already mentioned, the properties of the transducer remain substantially unchanged by the variations in the gap region. This is achieved in that all the dimension changes in the variations of the gaps remain relatively small in comparison to the transducer finger length. A completely sufficient effect is achieved when the dimension change in the variation of the gaps amounts to double the finger width of a transducer finger. The variation thereby lies far below the variations that are used to weigh the transducer, and to form the transfer function of the transducer. In contrast, with the invention even the admittance of the transducer should remain unchanged and only be reduced by the interfering excitation, which has nothing to do with the desired excitation. Completely without reciprocal action on the excitation function, a variation of the gaps remains that is only achieved via variation of the stump fingers. The overlapping length of the transducer fingers can be kept unchanged, and in particular be held constant over the transducer length. However, it is also possible to combine the variation with regard to the gaps with a normal phase weighting or omission weighting.

Likewise, the inventive variation in the gap region is not limited to normal finger transducers. It is also possible to inventively vary reflection-free split-finger transducers. Due to the doubled finger count with regard to a normal finger transducer, periodic variations thereby exhibit a period of four gaps in an advantageous manner. A minimum period of two wavelengths is thus achieved for the periodic variations that then leads to a folding of the interfering excitation function in the gap region, as already effected further above.

Likewise, inventive transducers can also be fashioned as recursive transducers whose reflectivity is set such that the transducer exhibits a preferred wave propagation direction. Given transducers that preferably enable a wave propagation in only one direction, one speaks of SPUDT transducers (single-phase unidirectional transducers), which are likewise inventively effected such that they exhibit a variation in the gap region. Since recursive transducers are characterized by different widths of the electrode fingers and/or separations of the electrode fingers, uniform variations of the gaps are not possible with regard to at least one gap feature in the directed transducers. In a simpler manner, however, in recursive transducers a splitting of the gaps into groups is possible, with which respectively a specific group pattern can be associated which can be inventively varied with regard to the type or transversal position over the transducer length.

The invention is also applicable given transducers that are implemented tilted due to the beam-steering effect (energy propagation direction of the surface wave not vertical to the electrode fingers), since here as well a variation of the gaps is possible.

A preferred application applies an inventive transducer in a surface wave conductor which, for example, is fashioned as a resonator filter. For example, the invention can be used in longitudinal dual mode resonator filters, what are known as DMS filters. However, it is also possible to inventively fashion the interdigital transducer from single-port resonators, and to use the latter in a reactance filter. It is thereby already of advantage when, within a reactance filter comprising a plurality of single-port resonators, only one filter comprises a resonator with an inventive transducer. Single-port resonators with inventive transducers are preferably used in the serial branch of reactance filters, since there the additional conductance of the known filters (that is disconnected with the invention) is particularly interferingly affected.

An inventive transducer can be fashioned on a piezoelectric film which in turn is applied to a substrate. Such a film can be produced in a thin-film method. However, an inventive transducer is preferably fashioned on monocrystalline substrates, for example on the known materials, such as quartz, lithium niobate, lithium tantalate or langasite. In addition to these customary substrates, however, the invention can also be used on all other piezoelectric substrates in which surface waves can be generated and are capable of propagation.

An inventive transducer can comprise a metallization made from a uniform material, in particular from aluminum and its alloys. However, it is also possible to fashion the transducer from a plurality of layers, whereby at least one part of the individual layers comprises aluminum as at least the main component. The remaining layers can be fashioned from Cu, Mg, Ti, Zr, Sc or also other metals. In this manner, a high stability of the transducer is achieved when an electrical signal with high power is coupled and is transduced into a surface wave.

Inventive transducers are not limited to uniform finger periods. Inventive transducers can therefore also exhibit increasing or decreasing finger widths and/or finger separations (=finger periods) in the longitudinal direction. Such transducers are also referred to as chirped transducers. Due to the periodicity changing over the transducer length, such a transducer exhibits an increased bandwidth.

A broadband transducer can also be achieved and inventively modified when it exhibits changing finger widths and/or finger separations in the transversal direction. Such transducer types are also referred to as FAN transducers. The variation of finger widths and/or finger separations can thereby, for example, ensue linearly or hyperbolically. Moreover, transducers viewed in the transversal direction can exhibit varying finger widths and/or finger separations, whereby this change is irregular.

It is also possible to fashion the transducer as a focusing transducer and to inventively modify it.

A further inventive transducer is fashioned as an irregular or, respectively, aperiodic transducer and is, for example, formed of different cells that respectively differentiate with regard to the finger widths and/or finger separations. Such an irregular transducer is achieved when the excitation function of the transducer is modulated, and all degrees of freedom, even finger separations and finger widths as well, are used for the modulation.

In the following, the invention is explained in detail using exemplary embodiments and Figures appertaining thereto.

BRIEF DESCRIPTION OF THE DRAWINGS

FIG. 1 is a section-by-section view of an inventive transducer with rectangular variation of the transversal position of the gaps;

FIG. 2 is a view of an inventive transducer with a further rectangular variation of the transversal gap position;

FIG. 5 shows variously shaped electrode finger ends;

FIG. 6 is a schematic view of a transducer with a combined linear variation of the gap position and the gap size;

FIG. 7 specifies a plurality of functions for variation of one-dimensional gap parameters;

DESCRIPTION OF THE PREFERRED EMBODIMENTS

FIG. 1 shows a simple embodiment of the invention. Shown section-by-section is a normal finger transducer 1 in the area of a busbar 3. This transducer comprises two electrode fingers 2 per wavelength. In this embodiment, the transducer is varied with regard to the transversal gap position. The absolute amount ΔD by which the gaps 4 are maximally displaced here amounts to less than two electrode finger widths (in a normal finger transducer thus less than a distance that corresponds to half a excitation light at middle frequency). Via displacement in pairs of two respectively adjacent gaps opposite the two respectively adjacent pairs of gaps, the interfering excitation in the gap region is multiplied in the time domains with a further excitation function that has a period of four SAW (Surface Acoustic Wave) wavelengths. A folding in the frequency range thereby results, and a splitting of the excitation, which thereby disappears from the stop band range.

FIG. 2 likewise shows, as a second exemplary embodiment, a rectangular variation of the transversal gap position in a transducer shown section-by-section. The gaps 4 are combined in groups G1, G2, G3, . . . , four gaps per, that are respectively transversally displaced opposite one another by a small amplitude. A folding of the original excitation also hereby results in the frequency range, which in turn leads to a splitting, with the result that the admittance of the interfering excitation disappears from the stop band range.

Figure 3:
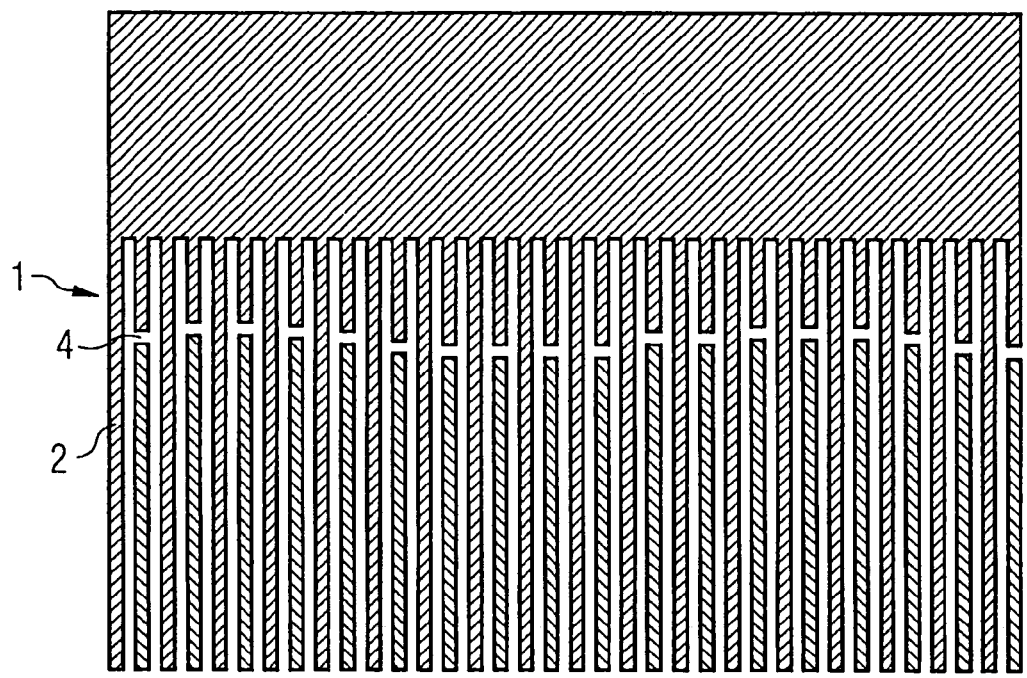
FIG. 3 is a view of a transducer with sinusoidal variation of the transversal gap position.

FIG. 3 shows a further embodiment of the invention in which likewise the transversal position of the gaps 4 is varied. Viewed over the length of the transducer, the transversal position of the gaps 4 follows a sine function as a transversal coordinate. This variation is thus periodic and exhibits a period length here of, for example, approximately 12 gaps.

Figure 4:
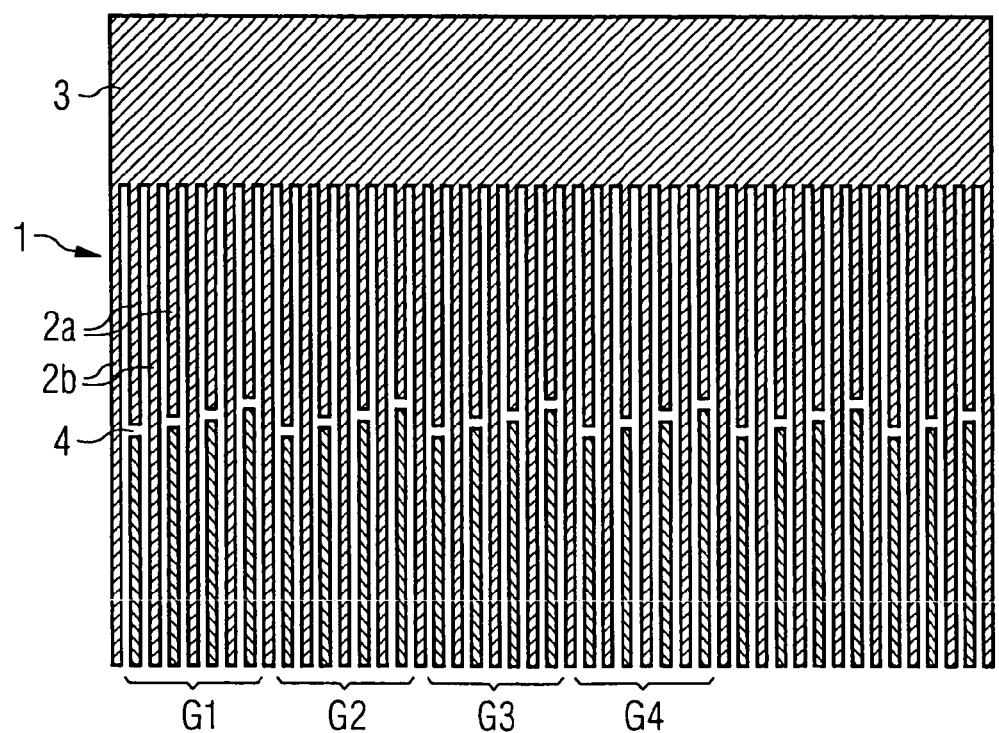
FIG. 4 is a view of a transducer with sawtooth-like variation of the transversal gap position.

FIG. 4 shows a further embodiment of the invention with variation of the transversal gap position. Viewed over the length of the transducer, the gaps 4 are thereby combined into groups G1, G2, G3, . . . , whereby each group Gn exhibits a uniform pattern. The pattern here is formed of a combination of the gap positions of the gaps 4 belonging to the group in the region of the shown busbar 3. Each group here comprises four gaps corresponding to a period of four wavelengths. Each pattern is here identical and exhibits in the group a linear variation of the transversal gap position. View over all groups Gn, a sawtooth-shaped variation of the gap position thereby results.

In the embodiment according to FIG. 4, all group patterns are identical and at the same height with regard to the transversal arrangement. However, it is also possible to namely use identical group patterns, but to transversally displace these against one another from group to group. This in turn can, for example, ensue with a rectangular function as it is shown in FIGS. 1 and 2 for groups of gaps. However, it is also possible to displace the patterns against one another according to an arbitrary other variation, preferably a periodic variation with regard to the transversal position.

In the exemplary embodiment specified above or, respectively, Figures appertaining thereto, the electrode finger ends that determine the shape of the gaps are shown as rectangular, such that a rectangular gap shape also results given the same finger ends. However, it is also possible to vary the shape of the finger ends, and therewith also the shape of the gaps. FIG. 5 shows by example five possible shapes of finger ends, whereby in FIG. 5a the known rectangular shape is shown. FIGS. 5b and 5c show two shapes of finger ends in which the finger ends are cut at a slant. FIG. 5d shows a rounded finger end, while the finger end according to FIG. 5e follows a concave function. The finger ends can, however, be inventively shaped arbitrarily.

FIG. 6 shows an inventive transducer in which, viewed over the length of the transducer, the gaps are varied with regard to the gap position, the gap size and the gap shape or, respectively, the shape of the electrode finger ends. A variation with regard to this is hereby achieved when the finger 2a (stump finger) connected with the lower busbar 3 exhibits a position of its finger ends that follows a combined linear function viewed over the length of the transducer. In section a, the length of the stump finger 2a decreases linearly in the direction x. The position of the finger ends thereby naturally shifts. In section b, the length of the stump finger 2a in turn increases linearly. Independent of the (however preferably with the same) period, the position of the ends of the fingers 2b that are connected with the opposite busbar 5 (only indicated in the Figure) varies. The change of the finger end positions are likewise linear here, such that in section a, the linearly increasing gap separation results in the direction X. In section b, a linearly decreasing gap separation is realized. Additionally, the shape of the finger ends can be varied such that the contour of the finger ends follows the contour of the envelope for all gaps. However, it is also possible for this or other embodiments to arbitrarily use the same or differently shaped finger ends.

In FIG. 7, a plurality of exemplary functions are shown whose gap features (which can be correspondingly expressed as one-dimensional quantities), such as gap position and gap size, are variable. The rectangular function according to FIG. 7a thereby corresponds to a variation as it was already shown using FIGS. 1 and 2 for the variations of the gap position. However, such a variation can also be applied to the size of the gaps. Likewise, the functions of FIGS. 7b and 7c correspond to variation possibilities as they were already realized for the variation of the gap position. Further exemplary functions are shown in FIGS. 7d, 7e and 7f.

However, it is also possible to simultaneously vary an inventive transducer according to a periodic function with regard to two features, whereby the selected function can be different for each of the gap features. While, for example, in FIG. 6 the position and the separation of the gaps are varied according to a function 7d, both gap features can also be simultaneously varied with arbitrary other combinations of the functions. The same period is preferably used for a simultaneous variation of the different features.

While in the previous exemplary embodiments the variation was only described in the region of one busbar, an inventive transducer preferably also exhibits the same or a similar variation in the region of the second busbar. If the variation of the gaps in the region of the other busbar is implemented with the same function, but another period or another phase, or with a completely different function, the interfering conductance of the upper and lower gaps is thus effected differently, and therewith shifted differently.

Figure 11:
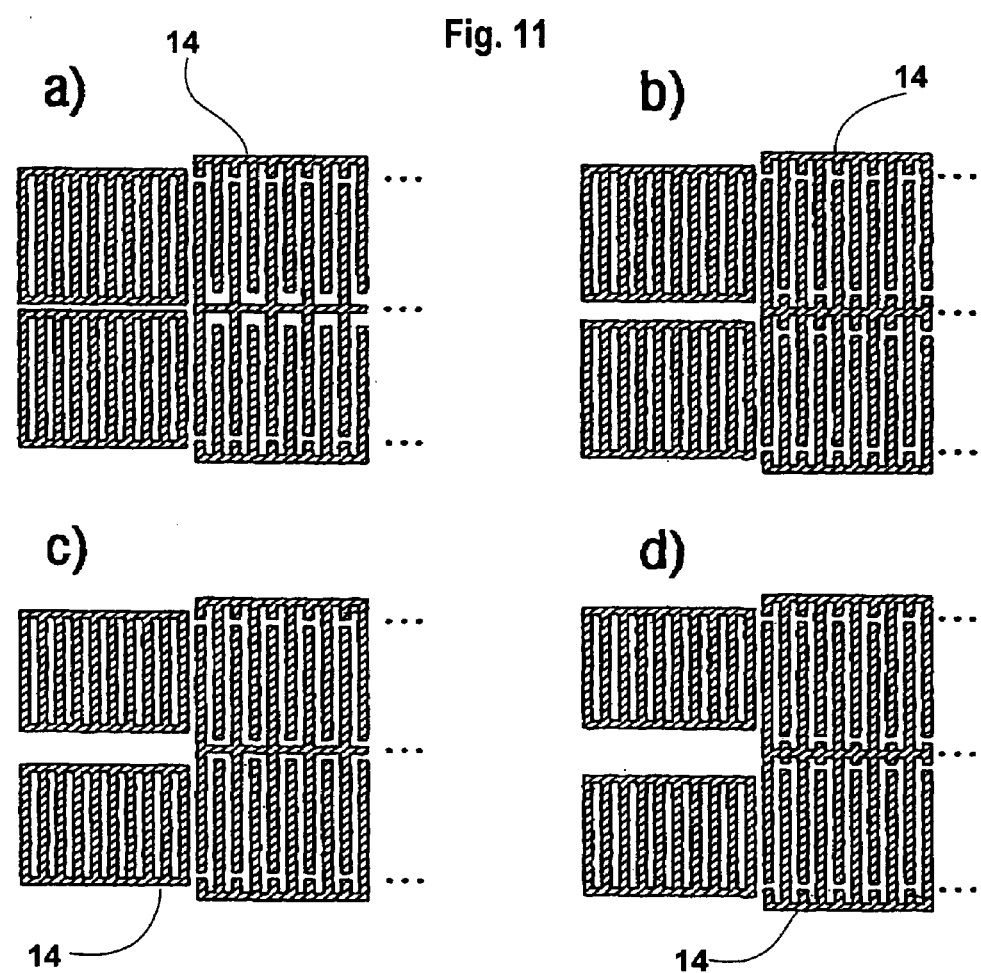
FIG. 11 is a four part drawing showing variations of cascading transducers with sub-transducers.

The invention can also be used in cascading single-port resonators 14, as shown in FIG. 11. These comprise a transducer that is divided into serially circuited sub-transducers. Such a sub-transducer comprises at least one electrode finger, however, preferably groups of electrode fingers, that are connected with a common busbar that is correspondingly fashioned long, connecting, and central (viewed transversally). The inventive variation can also thereby exhibit the gap size and/or the gap position and/or the shape of the finger ends. In particular given varying gap position, the connecting busbar can thereby follow the gap position. The central busbar arranged between two circuited sub-transducers can then be fashioned with different width or with stages.

Figure 8:
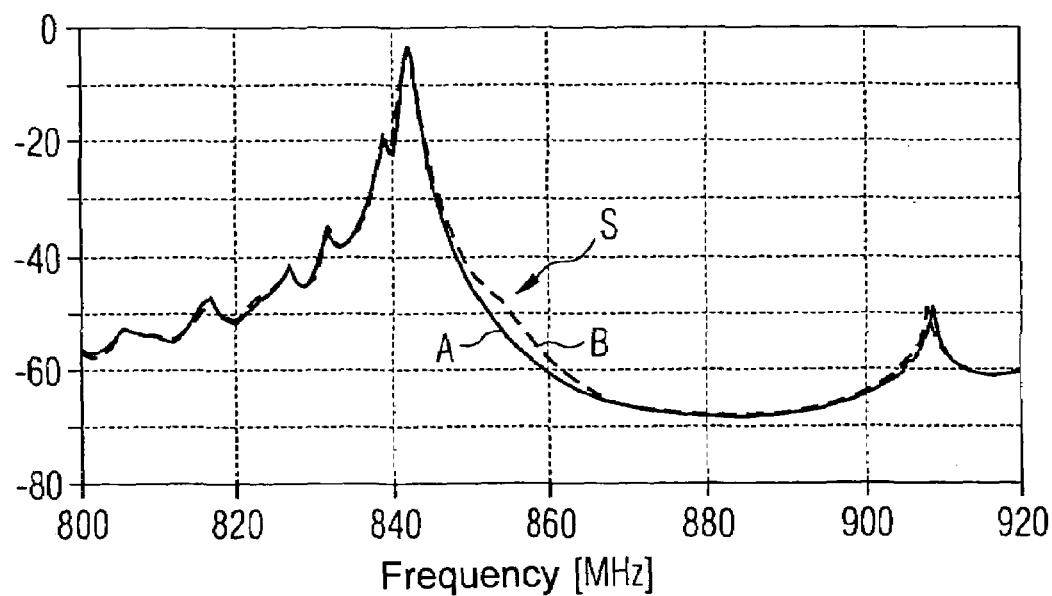
FIG. 8 is a graph comparing the input admittance of single-port resonators with inventive transducers with the admittance of single-port resonators with known transducers.

An inventive transducer can, for example, be used in single-port resonators. FIG. 8 shows the input admittance of a single-port resonator with an inventive transducer fashioned, for example, according to FIG. 1. The admittance of the resonator with inventive transducer is represented by the curve A, while a transducer identical in its other dimensions, however not provided with inventive gap variations, exhibits an input admittance according to the curve B. The input admittance of the known resonator shows an interfering conductance at the position S that acts as a hump in the curve. Single-port resonators with inventive transducers show in this region a steeply decreasing curve that corresponds to an ideal excitation with the desired primary mode.

In a reactance filter in a ladder-type execution, two circuited single-port resonators are used in the simplest embodiment (basic element). If, in the transverse branch (=parallel branch) of the reactance filter, a single-port resonator with the inventive transducer is used, an improved transmission behavior of the filter with an improved left edge (because it is steeper) is achieved. If, in the long branch (=serial branch) of the reactance filter, a single-port resonator with the inventive transducer is used, an improved transmission behavior of the filter is achieved with an improved (because it is less) insertion damping in a range above the average frequency.

Figure 9:
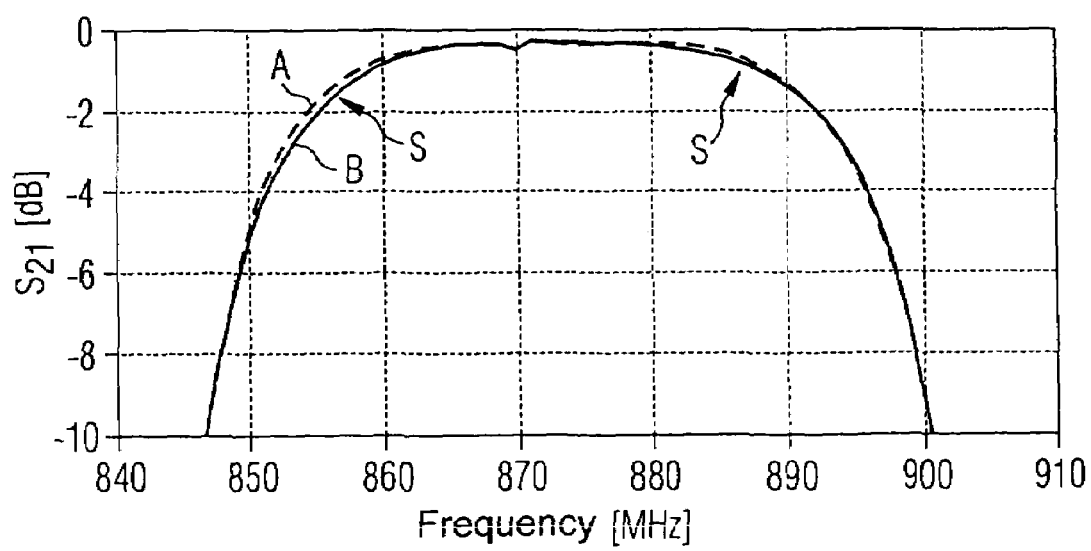
FIG. 9 is a graph showing the insertion dampening of a filter using single-port resonators with inventive transducers.

FIG. 9 shows the transmission behavior of such a reactance filter using the function $S_{21}$ applied over the wavelength (average frequency). Here the curve B also corresponds to the transmission behavior of a reactance filter with the known single-port resonators, while the curve A shows the transmission behavior of a filter comprises a single-port resonator with the inventive transducer in both the long branch and in the transverse branch. It is clear to see that the left edge (see arrow) is formed substantially more steeply, while the bandwidth of the filter according to curve A is only unsubstantially reduced. The lesser insertion dampening above the average frequency (see right arrow) is also recognizable. The transmission curve A is simultaneously flatter and shows a lower insertion dampening. This shows that with the inventive transducers, improved filters can be designed that are improved with regard to the edge steepness and the insertion dampening. A similar result is achieved when an inventive transducer is used to design a DMS filter, and thus a longitudinal dual mode resonator filter (DMS filter). Such a filter then comprises, for example, three inventive transducers that are arranged between two reflectors.

Figure 10:
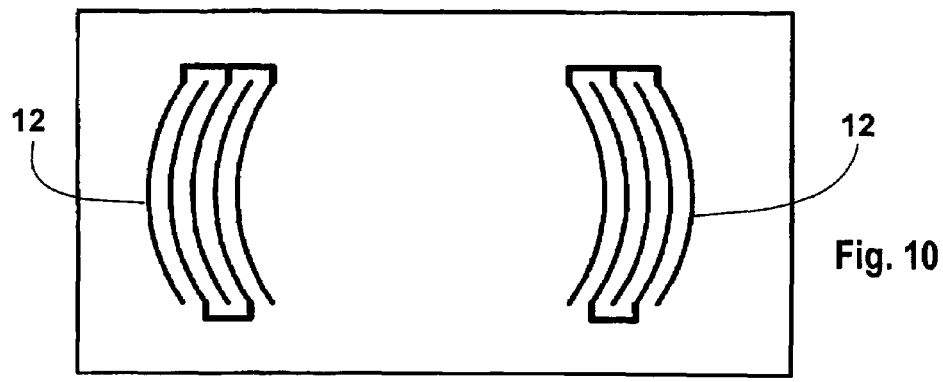
FIG. 10 is a schematic diagram of a SAW device with a focusing transducer.

It is also possible to fashion the transducer as a focusing transducer 12 as shown in FIG. 10.

It is also possible to use the inventive transducers in resonator filters coupled in transversal modes (TMR filter). Such filters exhibit such a high aperture that the acoustic wave is capable of propagating in the form of a plurality of transversal modes. Also, in such cases interfering excitations ensue in the region of the gaps that can be prevented with the invention.

The invention is further applied in identification markings in the surface wave technology. These comprise an inventive transducer and at least one reflector. An electrical signal applied to the transducer is thereby transduced into a surface wave, reflected on the reflector, and transduced back into an electrical signal again in the same transducer. With an inventive transducer or, respectively, with a delay line with an inventive transducer, the signal (normally unchanged after the double conversion) is less influenced by the interfering excitations.

Since the invention could only be shown using some selected exemplary embodiments, additional further variations with regard to the functional use for variation are also conceivable, such as the combination of the variations of a plurality of gap features parallel to one another, which is not shown here.

We claim:

1. An electro-acoustic transducer for a component operating with surface waves, said transducer comprising:
    interdigital fingers on a substrate with a number, width, longitudinal position and connecting sequence of the fingers of the transducer as well as the aperture determining the properties of the transducer, and
    means for suppressing interference excitation occurring in the region of the finger ends said means having variations with regard to at least one feature selected from transversal arrangement, size and shape of the gaps with the dimension changes and displacements of the gaps as a consequence of the variations being small in comparison to the finger length,
    wherein the amplitude of the variation of the transversal arrangement and size of the gaps does not exceed the double-finger width of the transducer.

2. An electro-acoustic transducer according to claim 1, wherein at least one portion of the gaps is combined into groups with a predetermined number of at least two gaps, each group extends over a length of at least two wavelengths, each group exhibits a pattern with regard to one of the transversal arrangement, size and shape of the gaps, the patterns being selected to largely correspond in all groups but displaced against one another in the transducer with regard to the absolute transversal position and show a variation from group to group that is periodic over all groups.

3. An electro-acoustic transducer according to claim 1, wherein the variations in the gap occur periodically.

4. An electro-acoustic transducer according to claim 3, wherein the periodic variation is implemented sinusoidally with regard to one of the transversal arrangement and size of the gaps.

5. An electro-acoustic transducer according to claim 3, wherein the periodic variation is implemented triangularly with regard to the transversal arrangement and size of the gaps.

6. An electro-acoustic transducer according to claim 3, in which the periodic variation is implemented semicircular with regard to the transversal arrangement and size of the gaps.

7. An electro-acoustic transducer according to claim 1, wherein the finger width, finger separation and finger connection sequence are fashioned so that the transducer is either a direct wave propagation transducer or a single-phase unidirectional transducer.

8. An electro-acoustic transducer according to claim 1, wherein the transducer is bounded on both sides by reflectors and is part of a component selected from a single-port resonator and a longitudinal dual mode resonator filter.

9. An electro-acoustic transducer according to claim 1, wherein the substrate comprises a piezoelectric film arranged on a second substrate of a different material.

10. An electro-acoustic transducer according to claim 1, wherein the substrate on which the fingers are arranged comprises a piezoelectric substrate made from a group consisting of quartz, lithium niobate, lithium tantalite and langasite.

11. An electro-acoustic transducer according to claim 1, wherein the fingers are a uniform assembly selected from aluminum, and a multi-layer assembly comprising a single layer with aluminum as the primary component.

12. An electro-acoustic transducer according to claim 1, wherein the transducer is a split-finger transducer.

13. An electro-acoustic transducer according to claim 1, wherein the finger widths and finger separations increase in the longitudinal direction.

14. An electro-acoustic transducer according to claim 1, wherein said transducer is fashioned as a focusing transducer.

15. An electro-acoustic transducer according to claim 1, wherein the finger widths and finger separations are selected to one of regularly and irregularly change in the transversal direction.

16. An electro-acoustic transducer according to claim 1, wherein the finger widths and finger separations irregularly change in the longitudinal direction.

17. An electro-acoustic transducer according to claim 1, in which variations of size and transversal arrangement of the gaps in proximity to a busbar is provided on both sides of the transducer.

18. An electro-acoustic transducer according to claim 17, wherein the gaps are varied differently in the region of the finger ends lying opposite one another.

19. An electro-acoustic transducer according to claim 1, wherein the variation of gaps occurs statistically.

20. An electro-acoustic transducer according to claim 1, wherein said transducer is fashioned as a cascading transducer comprising sub-transducers which are electrically connected in series.

21. An electro-acoustic transducer according to claim 1, wherein said transducer is being utilized in a surface wave delay line.

22. An electro-acoustic transducer according to claim 1, wherein said transducer is being utilized in a transversal filter.

23. An electro-acoustic transducer according to claim 1, wherein said transducer is being utilized in a dual-mode resonator filter.

24. An electro-acoustic transducer as claimed in claim 1, wherein said transducer is a reactance filter assembled from SAW (Surface Acoustic Wave) single-port resonators, at least one of the single-port resonators comprising a transducer having interdigital fingers with the number, width, longitudinal position and connection sequence of the fingers as well as the aperture determining the properties of the transducer.

25. An electro-acoustic transducer according to claim 24, having a transverse branch exclusively comprising the single-port resonator.

26. An electro-acoustic transducer according to claim 24, which has both a long branch and a transverse branch comprising at least one single port resonator.

27. An electro-acoustic transducer for a component operating with surface waves, said transducer comprising:
  interdigital fingers on a substrate with a number, width, longitudinal position and connecting sequence of the fingers of the transducer as well as the aperture determining the properties of the transducer, and
  means for suppressing interference excitation occurring in the region of the finger ends, said means having variations with regard to at least one feature selected from transversal arrangement, size and shape of the gaps with the dimension changes and displacements of the gaps as a consequence of the variations being small in comparison to the finger length,
  wherein at least one portion of the gaps is combined into groups with a predetermined number of at least two gaps, each group extends over a length of at least two wavelengths, each group exhibits a pattern with regard to one of the transversal arrangement, size and shape of the gaps, the patterns being selected to largely correspond in all groups but displaced against one another in the transducer with regard to the absolute transversal position and show a variation from group to group that is periodic over all groups,
  wherein a number of the groups of gaps are divided into sub-groups that respectively exhibit sub-group patterns, and
  wherein within each group at least two different sub-group patterns alternately occur at least once per group.

28. An electro-acoustic transducer according to claim 27, in which at least two sub-groups are present, whereby within a sub-group only equal gaps occur with regard to the transverse arrangement, size and shape and wherein, however, the various sub-groups differ with regard to at least one feature.

29. An electro-acoustic transducer according to claim 27, wherein the pattern of the groups and sub-groups comprise one of a linear variation of the transversal position, a size of the gaps and a combination of a plurality of linear variations.

30. An electro-acoustic transducer according to claim 27, wherein each group has at least two sub-groups present with the same sub-group pattern with regard to the transversal arrangement in the sub-group as well as with regard to size and shape of the gaps, so that the pattern of the sub-groups are respectively arranged transversely displaced against one another.

31. An electro-acoustic transducer for a component operating with surface waves, said transducer comprising:
  interdigital fingers on a substrate with a number, width, longitudinal position and connecting sequence of the fingers of the transducer as well as the aperture determining the properties of the transducer, and
  means for suppressing interference excitation occurring in the region of the finger ends, said means having variations with regard to at least one feature selected from transversal arrangement, size and shape of the gaps with the dimension changes and displacements of the gaps as a consequence of the variations being small in comparison to the finger length,
  wherein the finger widths and finger separations increase in a transverse direction.

32. An electro-acoustic transducer for a component operating with surface waves, said transducer comprising:
  interdigital fingers on a substrate with a number, width, longitudinal position and connecting sequence of the fingers of the transducer as well as the aperture determining the properties of the transducer, and
  means for suppressing interference excitation occurring in the region of the finger ends, said means having variations with regard to at least one feature selected from transversal arrangement, size and shape of the gaps with the dimension changes and displacements of the gaps as a consequence of the variations being small in comparison to the finger length,
  wherein said transducer is incorporated in a transversal mode coupled resonator filter.

* * * * *